US010126389B2

(12) United States Patent
Ham

(10) Patent No.: US 10,126,389 B2
(45) Date of Patent: Nov. 13, 2018

(54) GRADIENT COIL ASSEMBLY WITH OUTER COILS COMPRISING ALUMINUM

(71) Applicant: KONINKLIJKE PHILIPS N.V., Eindhoven (NL)

(72) Inventor: Cornelis Leonardus Gerardus Ham, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 425 days.

(21) Appl. No.: 14/781,608

(22) PCT Filed: Mar. 21, 2014

(86) PCT No.: PCT/IB2014/060015
§ 371 (c)(1),
(2) Date: Oct. 1, 2015

(87) PCT Pub. No.: WO2014/162233
PCT Pub. Date: Oct. 9, 2014

(65) Prior Publication Data
US 2016/0047870 A1 Feb. 18, 2016

Related U.S. Application Data

(60) Provisional application No. 61/808,866, filed on Apr. 5, 2013.

(51) Int. Cl.
*G01V 3/00* (2006.01)
*G01R 33/385* (2006.01)
*H01F 6/06* (2006.01)
(52) U.S. Cl.
CPC ..... *G01R 33/3856* (2013.01); *G01R 33/3858* (2013.01); *H01F 6/06* (2013.01)

(58) Field of Classification Search
USPC ........................................................ 324/322
See application file for complete search history.

(56) References Cited

U.S. PATENT DOCUMENTS 5,296,810 A  3/1994 Morich
5,426,845 A  6/1995 Weideman
(Continued)

FOREIGN PATENT DOCUMENTS

EP  1381059 A1  1/2004
GB  2432898  6/2007
(Continued)

*Primary Examiner* — Rodney Fuller

(57) ABSTRACT

The present invention provides a gradient coil assembly (122) for use in a magnetic resonance imaging system (110) comprising a set of inner coils (142) and a set of outer coils (144), which are concentrically arranged in respect to a common rotational axis of the set of inner and outer coils (142, 144), wherein the set of inner coils (142) and a set of outer coils (144) can be controlled to generate gradient magnetic fields within an inner space of the gradient coil assembly (122), and at least one coil (152, 154, 156) of the set of outer coils (144) is at least partially made of aluminum. The present invention further provides a magnetic resonance (MR) imaging system (110) comprising the above magnetic gradient coil assembly (122). By replacing at least a part of one coil of the outer coils by aluminum, the gradient coil assembly (122) can be significantly improved in respect to cost and weight without reducing the accuracy in respect to the generation of diagnostic images based on magnetic resonance information. Accordingly, the outcome of an MR scan is not reduced. The outer coils usually contain about half the weight of the copper used for state of the art gradient coil assemblies.

24 Claims, 8 Drawing Sheets

(56) References Cited

U.S. PATENT DOCUMENTS

| | | |
|---|---|---|
| 5,543,770 A | 8/1996 | Sasaki |
| 6,311,389 B1 | 11/2001 | Uosaki et al. |
| 2003/0016018 A1* | 1/2003 | Arz .................. G01R 33/3854 324/322 |
| 2003/0025502 A1 | 2/2003 | Higuchi |
| 2003/0060701 A1 | 3/2003 | Elgin |
| 2004/0263307 A1 | 12/2004 | Christopherson |
| 2006/0073740 A1* | 4/2006 | Schuster ................ H01R 4/34 439/807 |
| 2007/0216411 A1* | 9/2007 | Eberler .............. G01R 33/3858 324/318 |
| 2008/0271839 A1* | 11/2008 | Clarke .............. G01R 33/3856 156/244.22 |
| 2009/0179646 A1* | 7/2009 | Fath .................. G01R 33/3858 324/318 |
| 2009/0261831 A1* | 10/2009 | Harter ................. G01R 33/385 324/318 |
| 2011/0121832 A1* | 5/2011 | Shvartsman ......... G01R 33/385 324/318 |
| 2012/0119741 A1 | 5/2012 | Kimmlingen et al. |
| 2012/0249148 A1* | 10/2012 | Evers .................. G01R 33/422 324/322 |
| 2012/0268116 A1* | 10/2012 | Zhu .................... G01R 33/3642 324/307 |
| 2013/0049755 A1* | 2/2013 | Hollis ................. G01R 33/385 324/322 |

FOREIGN PATENT DOCUMENTS

| | | |
|---|---|---|
| JP | 201037244 A | 6/2010 |
| JP | 2012063247 A | 3/2012 |
| JP | 2013039152 A | 2/2013 |
| WO | 02065149 A1 | 8/2002 |
| WO | 2009127956 A1 | 10/2009 |
| WO | 2012045153 A1 | 4/2012 |

* cited by examiner

GRADIENT COIL ASSEMBLY WITH OUTER COILS COMPRISING ALUMINUM

CROSS REFERENCE TO RELATED APPLICATIONS

This application is a U.S. national phase application of International Application No. PCT/IB2014/060015, filed on Mar. 21, 2014, which claims the benefit of U.S. provisional Application Ser. No. 61/808,866 filed on Apr. 5, 2013 and is incorporated herein by reference.

FIELD OF THE INVENTION

The invention relates to the field of gradient coil assemblies for magnetic resonance imaging systems and magnetic resonance imaging systems comprising such gradient coil assemblies.

BACKGROUND OF THE INVENTION

In magnetic resonance (MR) imaging systems, gradient coil assemblies are used to generate gradient magnetic fields. These gradient magnetic fields are generated in three axial directions, i.e. in the x, y, and z-direction of the gradient coil assemblies. Accordingly, gradient coil assemblies comprise an x-coil, a y-coil, and a z-coil. The z-coil and the respective z-direction correspond to the longitudinal direction of the gradient coil assemblies.

State of the art gradient coil assemblies comprise a set of inner coils and a set of outer coils with one coil for each direction, whereby the set of outer coils and the set of inner coils are provided in concentric cylinders, which are spaced apart. The set of outer coils generally provides a shielding of the set of inner coils to avoid the generation of eddy currents due to the changing magnetic fields of the gradient coil assembly. When referring to a coil, usually conductors are referred to, since they are responsible for conducting electrical current and generating the gradient fields. Other components, e.g. supporting structures or the like, are not explicitly mentioned.

Such state of the art gradient coils assemblies, as e.g. known from U.S. Pat. No. 5,426,845 A, comprise coils, which are generally made of copper to minimize the dissipation therein. Dissipation comprises losses due to electrical and magnetic properties of the copper. Also, copper is a material with excellent conductive properties in respect to electric current and heat. Drawbacks of using copper are that copper is an expensive and heavy material, so that the gradient coil assemblies as well as the MR imaging systems comprising such gradient coils assemblies are difficult to handle and to install, and involve high manufacturing costs.

SUMMARY OF THE INVENTION

It is an object of the invention to provide a gradient coil assembly for a magnetic resonance imaging system and a magnetic resonance (MR) imaging system comprising such a gradient coil assembly, which are easy to handle, cost efficient and enable reliable generation of magnetic resonance information during an MR imaging process.

This object is achieved by a gradient coil assembly for use in a magnetic resonance imaging system comprising a set of inner coils and a set of outer coils, which are concentrically arranged in respect to a common rotational axis of the set of inner and outer coils, wherein the set of inner coils and a set of outer coils can be controlled to generate gradient magnetic fields within an inner space of the gradient coil assembly, and at least one coil of the set of outer coils is at least partially made of aluminum.

This object is further achieved by a magnetic resonance (MR) imaging system, comprising a main magnet for generating a static magnetic field within an examination space, a magnetic gradient coil assembly for generating gradient magnetic fields superimposed to the static magnetic field, and a radio frequency antenna device for applying an RF field to the examination space to excite nuclei of a subject of interest.

A gradient coil is designed to be able to handle as high as possible Grms, which is the rms value of the gradient field. Consequently, the Irms, which is the rms value of the current, should be as high as possible. Nevertheless, the Irms is limited by hot spots in the gradient coil, i.e. areas with many conductors close to each other resulting in a high current density. In relatively cool areas of the gradient coil, i.e. areas having a low current density, the increase in dissipation does not lead to new hotspots that set lower boundaries on allowed Irms. Compared to the set of inner coils, the set of outer coils is a relatively area. Therefore, by replacing at least a part of one coil of the set of outer coils by aluminum, the gradient coil can be significantly improved in respect to cost and weight without reducing the accuracy in respect to the generation of diagnostic images based on magnetic resonance information. In other words, the outcome of an MR scan is not reduced. In particular, the outer coils are provided for shielding purposes, so that dissipation in the outer coil is not critical, even for high-performance coils. Since the outer coils usually contain about half the weight of the copper used for state of the art gradient coil assemblies, the reduction in weight and price, which can be achieved by at least partly replacing copper from at least one outer coil by aluminum, is high.

It is to be noted that the term "coil" as used here refers to conductive components only, i.e. conductors for conducting electrical current. Further components, may be required e.g. for mechanical integrity of other purposes, are not considered here.

According to a preferred embodiment the z-coil of the set of outer coils comprises a set of parallel conductive loops, whereby a first subset of the conductive loops is made of aluminum. The parallel arrangement of the conductive loops refers to a spatially parallel arrangement of the conductive loops. Electrically, the conductive loops are connected in series. The set of parallel conductive loops facilitates the provisioning of the coil partially made of aluminum, since individual conductive loops of e.g. copper can be easily replaced by conductive loops of aluminum.

According to a preferred embodiment at least one coil of the set of outer coils is entirely made of aluminum. An entire coil can easily be provided, so that connections between different materials within the coil are not required. Connections between aluminum and other materials can be difficult to create due to different properties of the different materials and can underlie corrosion, which reduces the durability of the connection. This is in particular the case for connections between aluminum and copper. The manufacturing of a coil of a single material is therefore easy to realize. The reduction and in weight and price, which can be achieved by replacing copper from an entire outer coil by aluminum is higher than by replacing the copper only partially in a coil.

According to a preferred embodiment the set of outer coils is made of aluminum. This provides a good reduction and in weight and price of the gradient coil assembly, which can be achieved without reducing the outcome of MR scans performed using this gradient coil. Also the set of outer coils can be provided with uniform characteristics and without connections of different materials. Connections between aluminum and other materials can be difficult to create due to different properties of the different materials and can underlie corrosion, which reduces the durability of the connection. This is in particular the case for connections between aluminum and copper. Dissipation in the outer coil is not critical, even for high-performance coils. Since the outer coils usually contain about half the weight of the copper used for state of the art gradient coil assemblies, the reduction in weight and price, which can be achieved replacing the copper from the set of outer coils by aluminum, is high.

According to a preferred embodiment the set of inner coils is made of copper. By providing the set of inner coils of copper, the inner coils are suitable for high quality MR scans. The dissipation is most critical in the inner coils since current densities are higher than in the outer coils. The performance of a gradient coil assembly is limited due to hot spots of the inner coil, which can be reduced by providing the set of inner coils made of copper.

According to a preferred embodiment at least one coil of the set of inner coils is at least partially made of aluminum. Depending on the design of the gradient coil assembly, at least parts of at least one coil of the set of inner coils can be provided in aluminum without reducing the outcome of the MR scan. Preferably, parts of the at least one coil, which are subject to low heating, are made of aluminum. Further preferred, cooling is applied at least partially to the set of inner coils, so that an increase in dissipation due to the use of aluminum is reduced or even equilibrated, and aluminum can be used at least partially for at least one coil without reducing the outcome of the MR scan. Further preferred, the set of inner coils is provided with cooling means for cooling the part of the at least one coil of the set of inner coils.

According to a preferred embodiment the z-coil of the set of inner coils comprises a set of parallel conductive loops, wherein a first subset of the conductive loops is made of aluminum. The parallel arrangement of the conductive loops refers to a spatially parallel arrangement of the conductive loops. Electrically, the conductive loops are connected in series. The set of parallel conductive loops facilitates the provisioning of the coil partially made of aluminum, since individual conductive loops of e.g. copper can be easily replaced by conductive loops of aluminum.

According to a preferred embodiment at least one coil of the set of inner coils is made of aluminum. The more aluminum is used in the set of inner coils, the higher the reduction in cost and weight of the gradient coil assembly and the MR imaging system using this gradient coil assembly.

According to a preferred embodiment the set of inner coils is made of aluminum. Even if the generation of hot spots is increased due to the use of aluminum, the set of inner coils is still suitable for provisioning MR information suitable for MR image generation. Depending on the use case, the outcome of the MR scan is still sufficient to provide low performance MR scans. Nevertheless, if sufficient cooling is applied to the set of inner coils, the performance of the overall MR imaging system can be improved to be high. A MR imaging system for high performance can be roughly characterized by gradients of at least 40 mT/m and a slew rate of at least 200 T/ms.

According to a preferred embodiment the set of parallel conductive loops comprises a second subset of conductive loops, which is made of copper, and the conductive loops of the first and second subset of conductive loops are alternately arranged along the axis of the z-coil. Depending on the number of conductive loops made of aluminum, the increase in dissipation can be controlled and limited to a level suitable for performing high quality MR scans. Preferably, the conductive loops of the second subset of conductive loops are provided as solid conductive loops made of copper to further improve dissipation.

According to a preferred embodiment at least one coil is at least partially provided with hollow conductors for circulating a coolant. The hollow conductors enable an efficient cooling at the source of the heat, which is generated in the coils. Accordingly, the cooling reduces the formation of hot spots in the conductors themselves and also in the vicinity thereof, which is indirectly cooled by the coolant circulating in the hollow conductors. The cooling improves the performance of the gradient coil assembly and of the MR imaging system comprising the gradient coil assembly, since it reduces dissipation in the gradient coil assembly. Accordingly, hot spots are reduced, and the Irms and therefore the Grms can be increased compared to a gradient coil assembly without cooling. Preferably, the coolant is a liquid, since liquids generally have a high heat capacity. Further preferred the coolant is water, which is easily available and has a good heat capacity. Furthermore, water is easily available in most places. Preferably, conductive loops of the z-coil of the set of inner and/or outer coils is provided as hollow conductors for circulating the coolant. Due to the arrangement of the z-coil, cooling can easily be implemented in the z-coil. This applies to the z-coil of the set of inner coils as well as to the z-coil of the set of outer coils. Nevertheless, the bigger amount of heat is generated in the set of inner coils, so that cooling of the set of inner coils is most important. Still further preferred, the first subset of the conductive loops of the z-coil of the set of inner and/or outer coils are individually provided as hollow conductive loops. The hollow conductors can be made of aluminum or copper.

According to a preferred embodiment an interface between the aluminum of the gradient coil assembly and a different conductive material is enclosed by a moisture seal. Such interfaces occur at any place, where aluminum is in contact with the different conductive material. Accordingly, such interfaces can exist within a coil, when different materials are used within the coil, or between different coils, when one coil is made of aluminum and the other coil is made of a different conductive material. E.g. the inner and outer coils are electrically connected by a conductor. Accordingly, when the outer coil is made of aluminum and the inner coil of a different conductive material, there must be an interface between one coil and the conductor or along the conductor. Preferably, the different conductive material is copper. One of the biggest risks of interfaces between aluminum and copper or other conductive materials is corrosion. This no problem as long as moisture is kept away from the interface. This is achieved by the moisture seal, which protects the interface against corrosion. Preferably, the moisture seal is provided as an epoxy enclosure covering the interface. The epoxy material can be easily applied and provides a reliable moisture seal.

According to a preferred embodiment the at least one coil is at least partially made of aluminum, which is copper clad. Copper clad aluminum can be soldered in the same way as copper plate, so that the manufacturing process for the gradient coil assembly does not have to be changed from currently known manufacturing processes. Furthermore, the risk of corrosion is reduced since the aluminum is not exposed to moisture and oxygen.

According to a preferred embodiment the gradient coil assembly comprises cooling means for indirectly cooling the set of inner and/or outer coils. The cooling means reduce the risk of hot spots of the set of inner and/or outer coils, so that aluminum can be used at least partially in the coils without reducing the performance of the gradient coil assembly and the MR imaging system comprising the gradient coil assembly. Preferably, the cooling means for indirectly cooling the set of inner and/or outer coils comprise cooling channels, which are located in vicinity to the set of inner and/or outer coils, respectively. A coolant is circulated through the cooling channels during operation of the gradient coil assembly.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
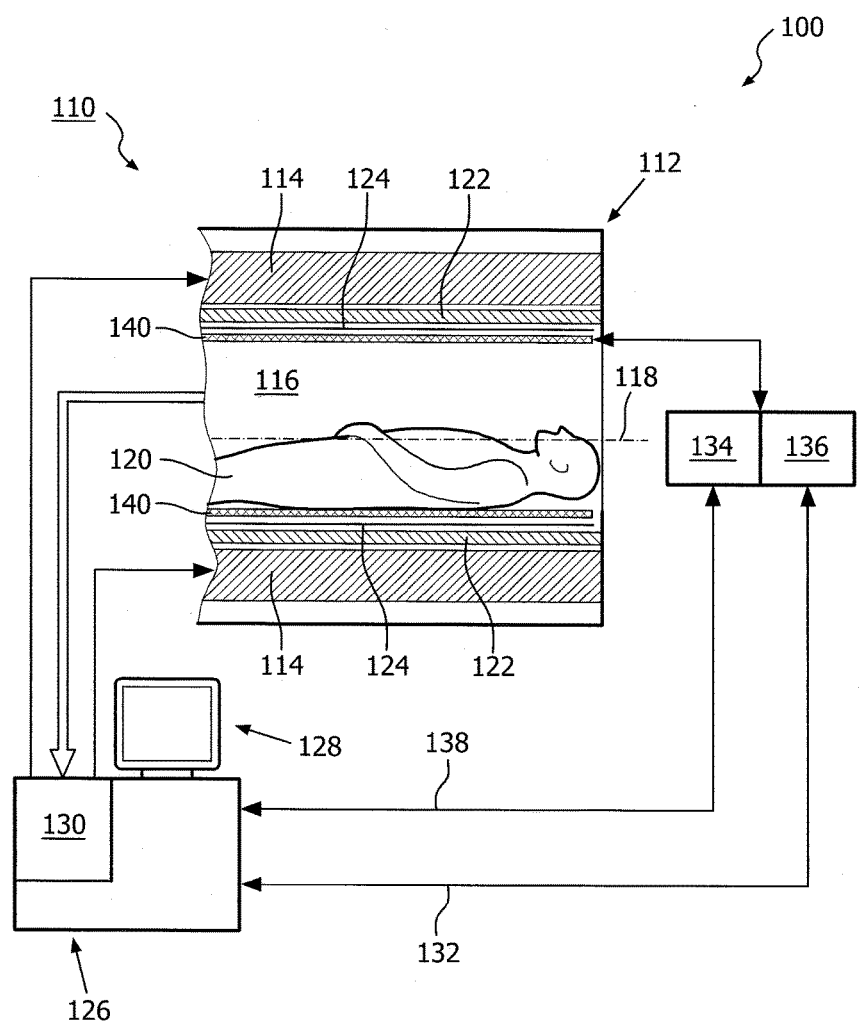
FIG. 1 shows a schematic illustration of a first embodiment of a magnetic resonance imaging system in accordance with the invention.

FIG. 1 shows a schematic illustration of an embodiment of a magnetic resonance (MR) imaging system 110. The MR imaging system 110 comprises an MR scanner 112 and includes a main magnet 114 provided for generating a static magnetic field. The main magnet 114 has a central bore that provides an examination space 116 around a center axis 118 for a subject of interest 120, usually a patient, to be positioned within. In this embodiment, the central bore and therefore the static magnetic field of the main magnet 114 has a horizontal orientation in accordance with the center axis 118. In an alternative embodiment, the orientation of the main magnet 114 can be different. Further, the MR imaging system 110 comprises a magnetic gradient coil assembly 122 provided for generating gradient magnetic fields superimposed to the static magnetic field. The magnetic gradient coil assembly 122 is concentrically arranged within the bore of the main magnet 114, as known in the art.

Further, the MR imaging system 110 includes a radio frequency (RF) antenna device 140 designed as a whole-body coil having a tubular body. The RF antenna device 140 is provided for applying an RF magnetic field to the examination space 116 during RF transmit phases to excite nuclei of the subject of interest 120. The RF antenna device 140 is also provided to receive MR signal from the excited nuclei during RF receive phases. In a state of operation of the MR imaging system 110, RF transmit phases and RF receive phases are taking place in a consecutive manner. The RF antenna device 140 is arranged concentrically within the bore of the main magnet 114. As is known in the art, a cylindrical metal RF screen 124 is arranged concentrically between the magnetic gradient coil assembly 122 and the RF antenna device 140.

Moreover, the MR imaging system 110 comprises an MR image reconstruction unit 130 provided for reconstructing MR images from the acquired MR signals and an MR imaging system control unit 126 with a monitor unit 128 provided to control functions of the MR scanner 112, as is commonly known in the art. Control lines 132 are installed between the MR imaging system control unit 126 and an RF transmitter unit 134 that is provided to feed RF power of an MR radio frequency to the RF antenna device 140 via an RF switching unit 136 during the RF transmit phases. The RF switching unit 136 in turn is also controlled by the MR imaging system control unit 126, and another control line 138 is installed between the MR imaging system control unit 126 and the RF switching unit 136 to serve that purpose. During RF receive phase, the RF switching unit 136 directs the MR signals from the RF antenna device 140 to the MR image reconstruction unit 130 after pre-amplification.

The magnetic gradient coil assembly 122 of the MR imaging system 110 is shown in detail in FIGS. 2 to 10 in two different embodiments. First, a generic, first embodiment will be described with reference to FIGS. 2 to 8.

Figure 2:
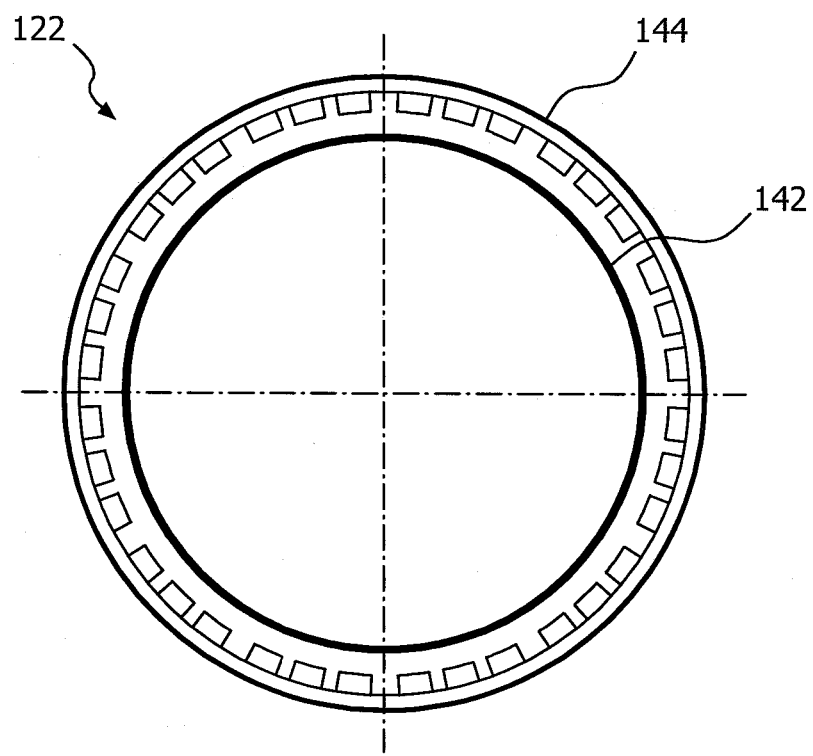
FIG. 2 shows a cross-sectional view of the gradient coil assembly of the MR imaging system of FIG. 1.
Figure 3:
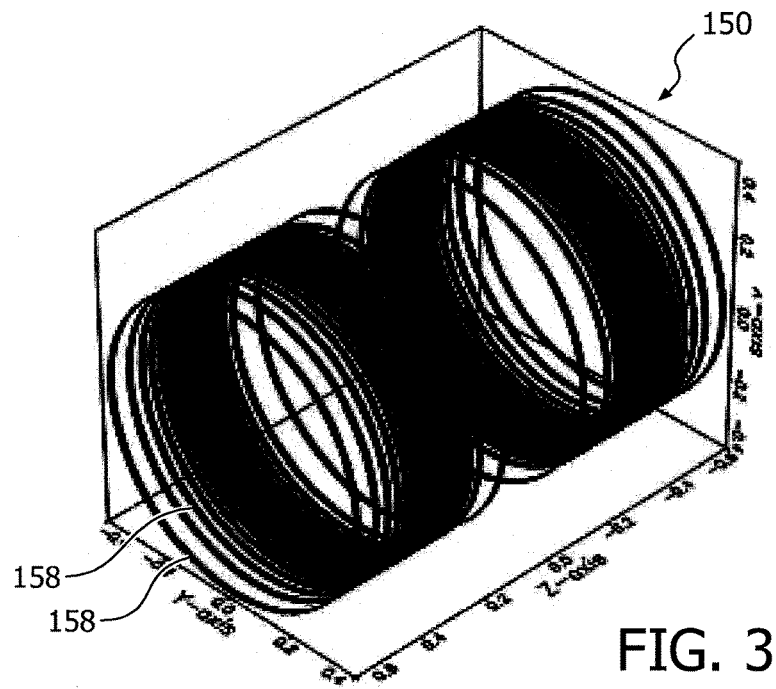
FIG. 3 shows a perspective view of a z-coil of a set of inner coils of the gradient coil assembly of FIG. 2.
Figure 4:
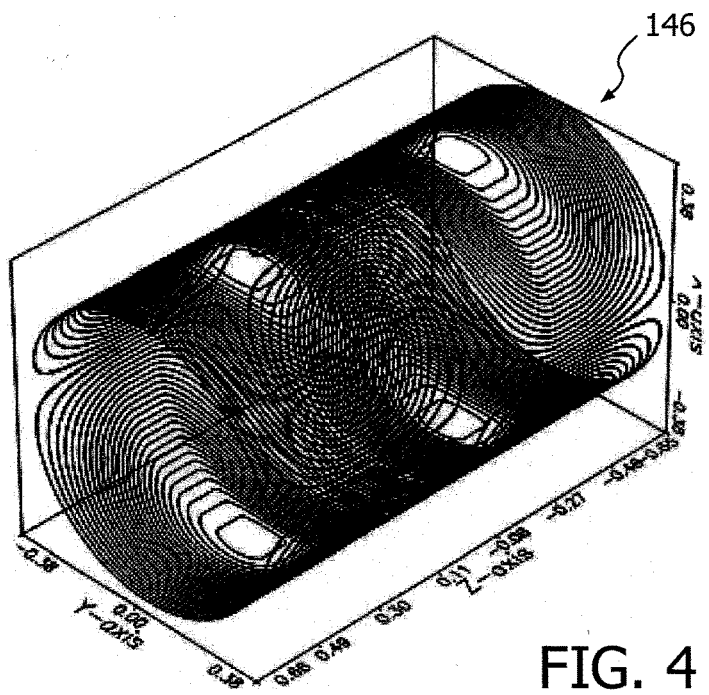
FIG. 4 shows a perspective view of an x-coil of the set of inner coils of the gradient coil assembly of FIG. 2.
Figure 5:
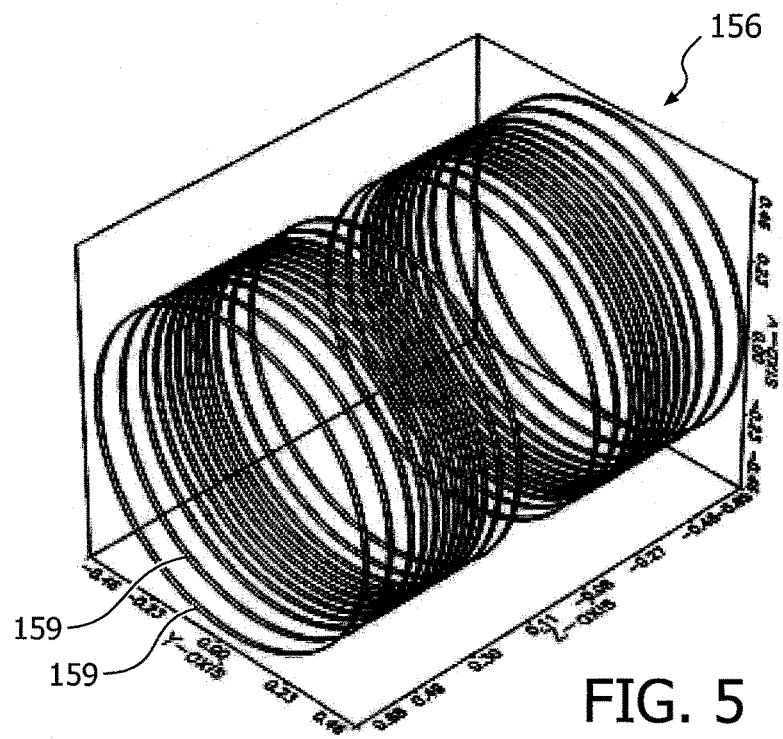
FIG. 5 shows a perspective view of a z-coil of a set of outer coils of the gradient coil assembly of FIG. 2.
Figure 6:
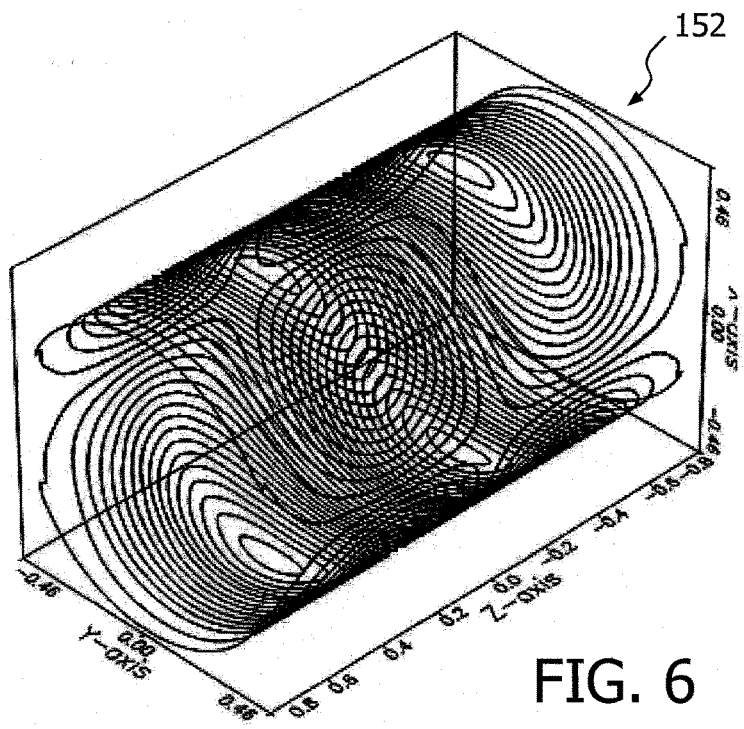
FIG. 6 shows a perspective view of an x-coil of the set of outer coils of the gradient coil assembly of FIG. 2.

The magnetic gradient coil assembly 122 comprises two sets of coils 142, 144, a set of inner coils 142 and a set of outer coils 144, as can be seen in FIG. 2. Each set of coils 142, 144 comprises three individual coils 146, 148, 150, 152, 154, 156 for the respective x, y, and z-direction. Accordingly, the coils 146, 148, 150, 152, 154, 156 are referred to as x-coils 146, 152, y-coils 148, 154 and z-coils 150, 156. FIG. 3 shows the z-coil 150 of the set of inner coils 142. FIG. 4 shows the x-coil 146 of the set of inner coils 142. FIG. 5 shows the z-coil 156 of the set of outer coils 144. FIG. 6 shows the x-coil 152 of the set of outer coils 144. The y-coils 148, 154 are not shown entirely in the figures, but are similar to the x-coils 146, 152 with a rotational angle of 90 degrees in respect to the longitudinal axis of the magnetic gradient coil assembly 122, which corresponds with the z-axis.

Figure 7:
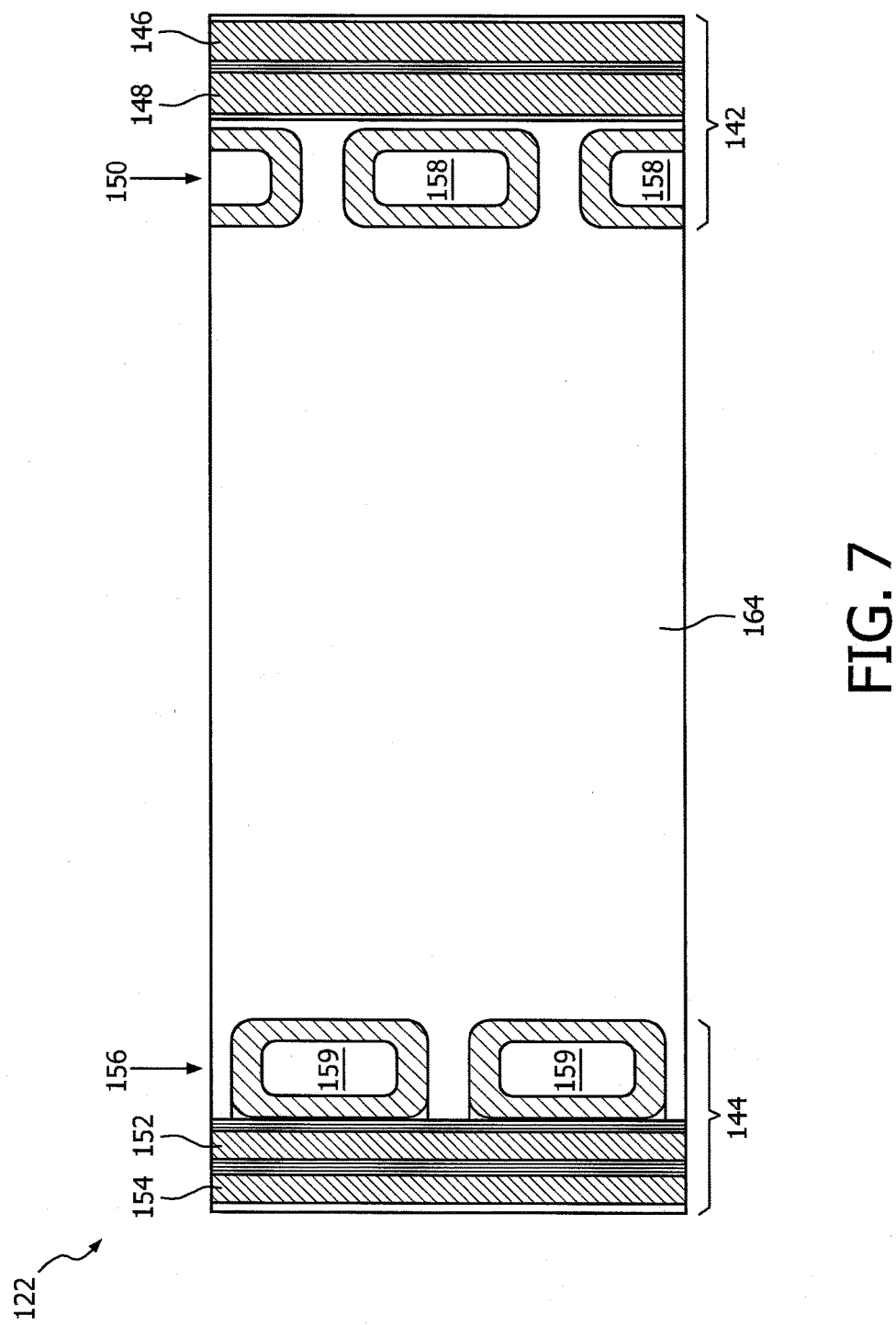
FIG. 7 shows a longitudinal sectional view of the gradient coil assembly of FIG. 2 at its circumference, which has been simplified by omitting components not essential for the invention.

The arrangement of the individual coils 146, 148, 150, 152, 154, 156 can be seen in FIG. 7. The set of inner coils 142 is cylindrically arranged in an inner part of the magnetic gradient coil assembly 122, whereby the set of inner coils 142 is arranged with the x-coil 146 being the inner coil, the y-coil 148 being the center coil, and the z-coil 150 being the outer coil in a direction radially outwards of the magnetic gradient coil assembly 122. The set of outer coils 144 is cylindrically arranged n a radially outward area of the magnetic gradient coil assembly 122, whereby the set of outer coils 144 is arranged with the z-coil 156 being the inner coil, the x-coil 152 being the center coil, and the y-coil 154 being the outer coil in a direction radially outwards of the magnetic gradient coil assembly 122.

As can be further seen in FIG. 7, the z-coil 150, 156 of the set of inner and outer coils 142, 144 comprises a set of inner and outer conductive loops 158, 159, respectively, which are arranged in parallel to each other along the z-axis of the magnetic gradient coil assembly 122. The parallel arrangement of the inner and outer conductive loops 158,159 refers to a spatially parallel arrangement of the inner and outer conductive loops 158,159. Electrically, the inner and outer conductive loops 158,159 are connected in series. The inner and outer conductive loops 158,159 are provided as hollow inner and outer conductive loops 158,159 for circulating a coolant therein, as can be best seen in FIG. 7.

In this embodiment, the set of outer coils 144 and the z-coil 150 of the set of inner coils 142 are made of aluminum, whereas the y-coil 148 and the z-coil 150 of the set of inner coils 142 are made of copper. The x-coils 146, 152 and y-coils 148, 154 are provided as massive coils.

Figure 8:
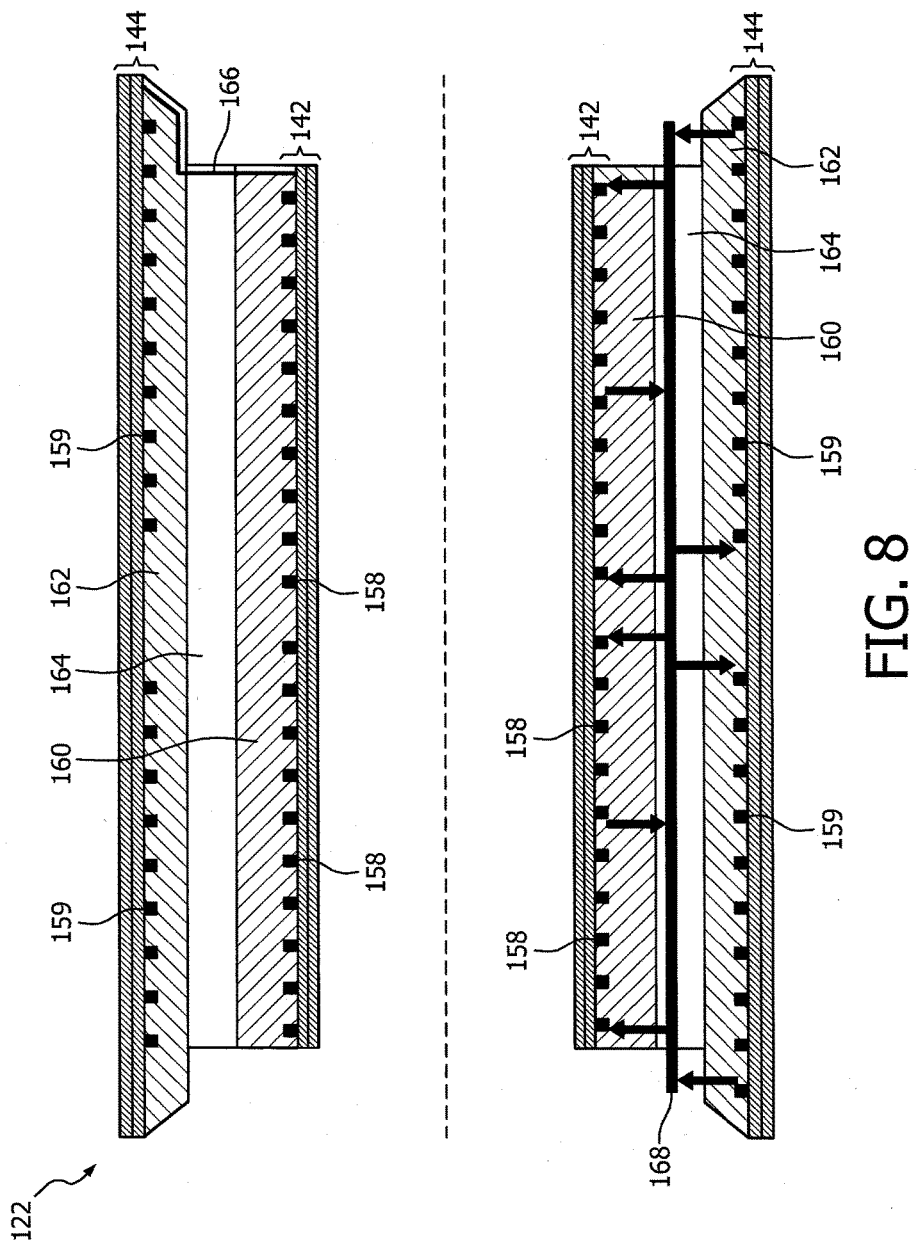
FIG. 8 shows a longitudinal sectional view of the gradient coil assembly of FIG. 2 as a schematic drawing.

As can be seen in FIG. 8, the set of inner coils 142 is attached to an inner side of and inner carrier tube 160, and the set of outer coils 144 is attached to an outer side of an outer carrier tube 162. The inner and outer carrier tubes 160,162 are separated by a hollow area 164. As can be further seen in FIG. 8, the coils 146, 148, 150, 152, 154, 156 of the sets of inner and outer coils 142, 144 are electrically connected by means of conductors, from which the conductor 166 between the y-coils 148, 154 is shown in FIG. 8 by way of example. The conductor 166 is made of aluminum.

Accordingly, between the conductor 166 and the y-coil 148 of the set of inner coils 142 is formed an interface between the copper of the y-coil 148 and the aluminum of the conductor 166. The interface is in a way not shown in the figures enclosed by a moisture seal, which is provided as epoxy enclosure of the interface.

Furthermore, water pipes 168 are provided in the hollow area 164, which are connected to the hollow conductive loops 158 of the z-coils 150, 156 of both set of coils 142, 144. During operation, a coolant, which is water in this embodiment, is circulated through the water pipes 168 and the z-coils 150, 156 for cooling of the magnetic gradient coil assembly 122.

Figure 9:
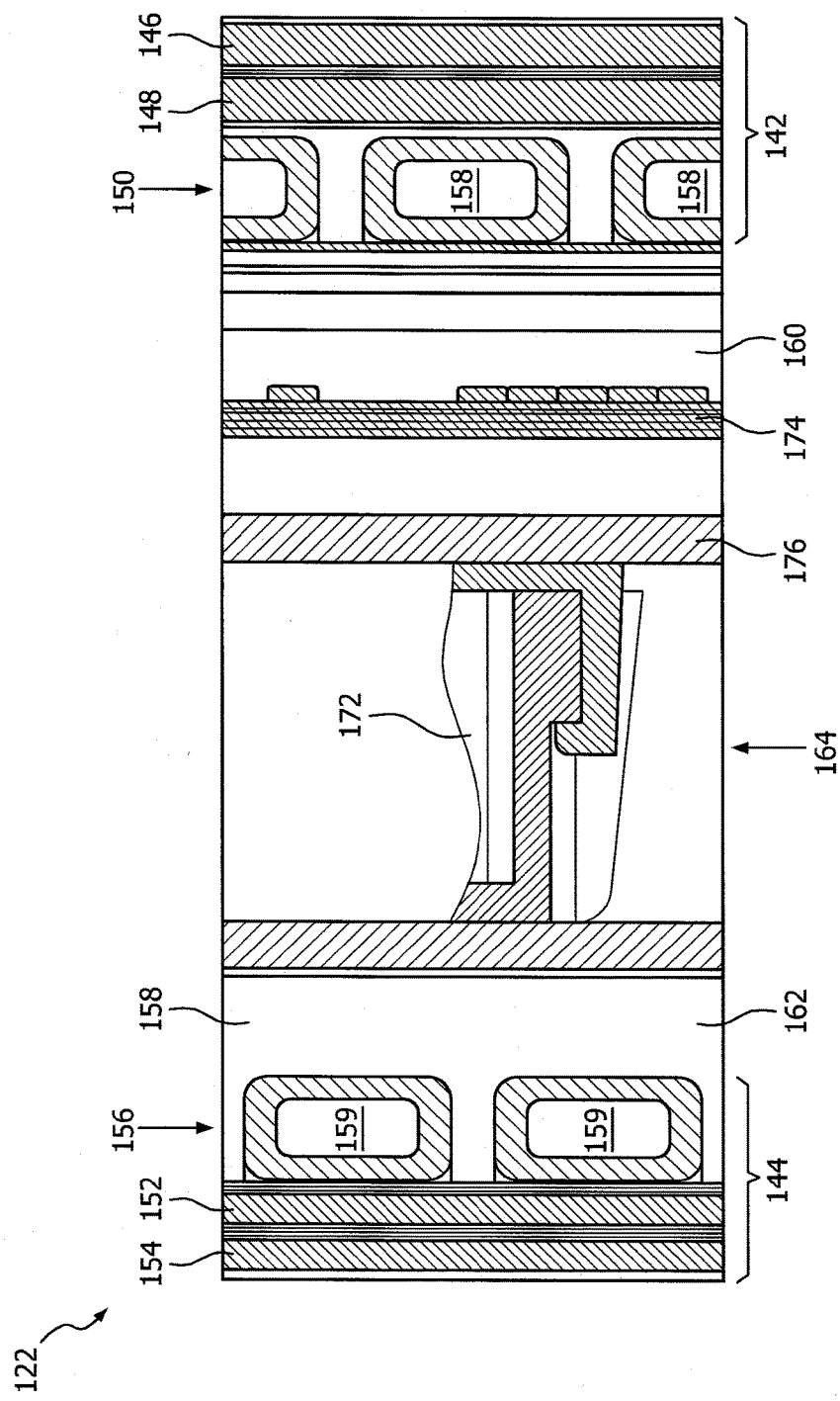
FIG. 9 shows a longitudinal sectional view of the gradient coil assembly of FIG. 2 at its circumference according to a second embodiment including components not essential for the invention.
Figure 10:
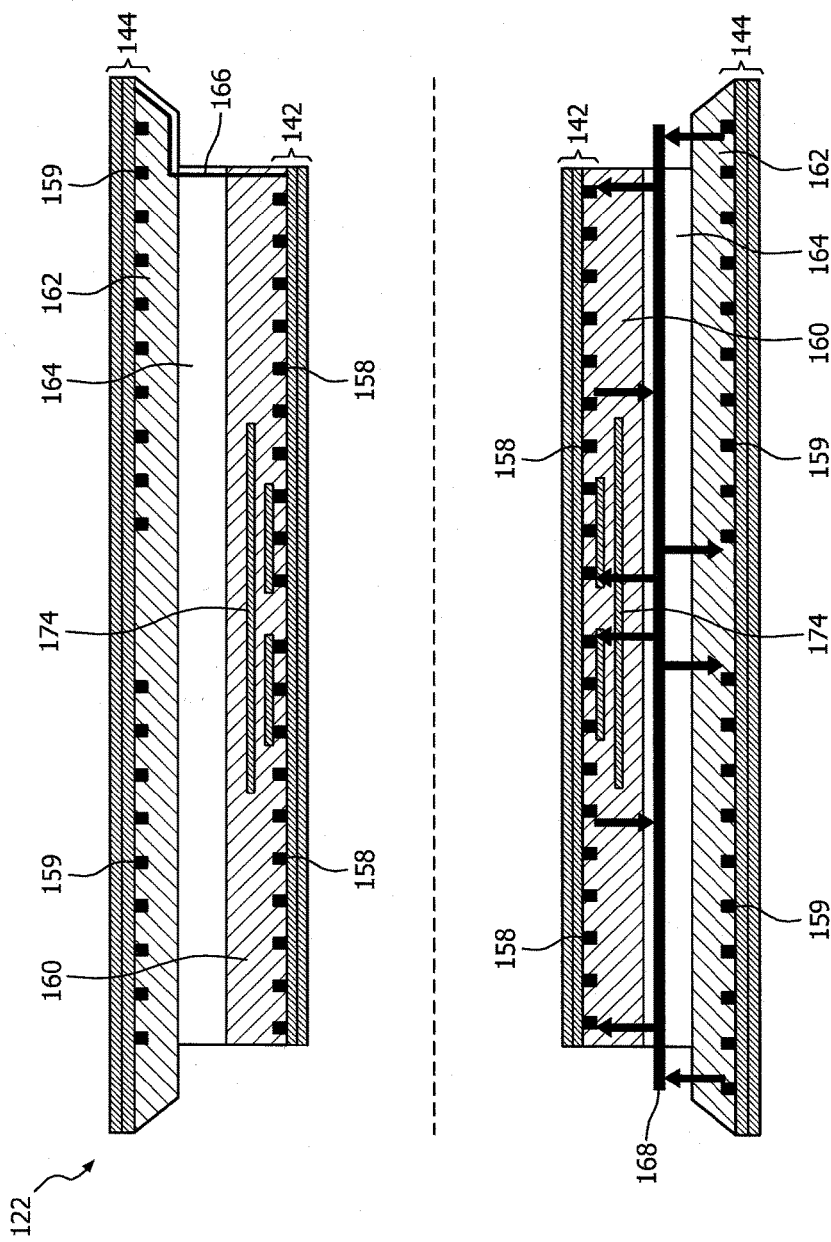
FIG. 10 shows a longitudinal sectional view of the gradient coil assembly of FIG. 9 as a schematic drawing.

A magnetic gradient coil assembly 122 according to a second embodiment is shown in FIGS. 9 and 10. The magnetic gradient coil assembly 122 is essentially identical to that of the first embodiment with additional components, as further described below. Accordingly, only the differences between the magnetic gradient coil assemblies 122 of the first and second embodiment will be described, and the same reference numerals will be used.

The magnetic gradient coil assembly 122 of the second embodiment comprises in addition to the magnetic gradient coil assembly 122 of the first embodiment shim trays 172, which are filled with iron shim plates and arranged in the hollow area 164, and shimming coils 174, which are arranged in the in the inner carrier tube 160. The shim trays 172 and shimming coils 174 are provided to enable shimming for to eliminating inhomogeneities in the magnetic field. The shim trays 172 and the shimming coils 174 are separated by a pulltrusion profile layer 176. A glass reinforced epoxy layer 178 is provided at the inner side of the set of outer coils 144.

One difference between the magnetic gradient coil assembly 122 of the first and second embodiment is that the set of outer coils 144 and the z-coil 150 of the set of inner coils 142 are made of copper clad aluminum. The y-coil 148 and the z-coil 150 of the set of inner coils 142 are made of copper in accordance with the first embodiment of the magnetic gradient coil assembly 122. In an alternative embodiment, the moisture seal at the interface is omitted.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 110 magnetic resonance (MR) imaging system
112 magnetic resonance (MR) scanner
114 main magnet
116 RF examination space
118 center axis
120 subject of interest
122 magnetic gradient coil assembly
124 RF screen
126 MR imaging system control unit
128 monitor unit
130 MR image reconstruction unit
132 control line
134 RF transmitter unit
136 RF switching unit
138 control line
140 radio frequency (RF) antenna device
142 set of inner coils
144 set of outer coils
146 inner x-coil
148 inner y-coil
150 inner z-coil
152 outer x-coil
154 outer y-coil
156 outer z-coil
158 inner conductive loop
159 outer conductive loop
160 inner carrier tube
162 outer carrier tube
164 hollow area
166 conductor
168 water pipe
172 shim tray
174 shimming coils
176 pulltrusion profile layer
178 glass reinforced epoxy layer

The invention claimed is:
1. A gradient coil assembly for use in a magnetic resonance imaging system comprising:
    a set of inner coils and a set of outer coils, which are concentrically arranged in respect to a common rotational axis of the set of inner and outer coils, the set of inner coils and the set of outer coils configured to be controlled to generate gradient magnetic fields within an inner space of the gradient coil assembly, at least one coil of the set of outer coils at least partially comprises copper clad aluminum.

2. The gradient coil assembly according to claim 1, wherein a z-coil of the set of outer coils comprises a set of parallel conductive loops, and a first subset of outer conductive loops is aluminum.

3. The gradient coil assembly according to claim 1, wherein at least one coil of the set of outer coils is entirely aluminum.

4. The gradient coil assembly according to claim 1, wherein the set of outer coils is aluminum.

5. The gradient coil assembly according to claim 1, wherein the set of inner coils is copper.

6. The gradient coil assembly according to claim 1, wherein at least one coil of the set of inner coils is at least partially aluminum.

7. The gradient coil assembly according to claim 6, wherein a z-coil of the set of inner coils comprises a set of parallel conductive loops, and a first subset of the parallel conductive loops is aluminum.

8. The gradient coil assembly according to claim 7, wherein the set of parallel conductive loops comprises a second subset of conductive loops, the second subset of conductive loops being copper, and
the first and second subsets of conductive loops are alternately arranged along a longitudinal axis of a z-coil.

9. The gradient coil assembly according to claim 6, wherein at least one coil of the set of inner coils is aluminum.

10. The gradient coil assembly according to claim 6, wherein the set of inner coils is aluminum.

11. The gradient coil assembly according to claim 1, wherein at least one coil is at least partially provided with hollow conductors for circulating a coolant.

12. The gradient coil assembly according to claim 1, wherein an interface between the aluminum of the gradient coil assembly and a different conductive material is enclosed by a moisture seal.

13. A magnetic resonance (MR) imaging system, comprising:
a main magnet for generating a static magnetic field within an examination space;
a magnetic gradient coil assembly for generating gradient magnetic fields superimposed to the static magnetic field, the magnetic gradient coil assembly comprising:
a set of inner coils and a set of outer coils, the set of inner coils and the set of outer coils being concentrically arranged in respect to a common rotational axis, the set of inner coils and the set of outer coils configured to be controlled to generate gradient magnetic fields within an inner space of the magnetic gradient coil assembly, at least one coil of the set of outer coils at least partially being copper clad aluminum; and
a radio frequency (RF) antenna device for applying an RF field to the examination space to excite nuclei of a subject of interest.

14. The MR imaging system according to claim 13, wherein a z-coil of the set of outer coils comprises a set of parallel conductive loops, and a first subset of outer conductive loops is aluminum.

15. The MR imaging system according to claim 13, wherein at least one coil of the set of outer coils is entirely aluminum.

16. The MR imaging system according to claim 13, wherein the set of outer coils is aluminum.

17. The MR imaging system according to claim 13, wherein the set of inner coils is copper.

18. The MR imaging system according to claim 13, wherein at least one coil of the set of inner coils is at least partially aluminum.

19. The MR imaging system according to claim 18, wherein a z-coil of the set of inner coils comprises a set of parallel conductive loops, and a first subset of the parallel conductive loops is aluminum.

20. The MR imaging system according to claim 19, wherein the set of parallel conductive loops comprises a second subset of conductive loops, which is copper, and
the first and second subsets of conductive loops are alternately arranged along a longitudinal axis of a z-coil.

21. The MR imaging system according to claim 18, wherein at least one coil of the set of inner coils is aluminum.

22. The MR imaging system according to claim 18, wherein the set of inner coils is aluminum.

23. The MR imaging system according to claim 13, wherein at least one coil is at least partially provided with hollow conductors for circulating a coolant.

24. The MR imaging system according to claim 13, wherein an interface between the aluminum of the magnetic gradient coil assembly and a different conductive material is enclosed by a moisture seal.

* * * * *